United States Patent
Wang

(10) Patent No.: US 12,315,577 B2
(45) Date of Patent: May 27, 2025

(54) MEMORY DEVICE AND PROGRAM OPERATION THEREOF TO REDUCE CAPACITIVE COUPLING

(71) Applicant: Yangtze Memory Technologies Co., Ltd., Hubei (CN)

(72) Inventor: Yu Wang, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 183 days.

(21) Appl. No.: 18/071,026

(22) Filed: Nov. 29, 2022

(65) Prior Publication Data

US 2023/0170034 A1 Jun. 1, 2023

(30) Foreign Application Priority Data

Nov. 29, 2021 (CN) .......................... 202111430730.1

(51) Int. Cl.
  *G11C 16/34* (2006.01)
  *G11C 16/08* (2006.01)
  *G11C 16/10* (2006.01)
(52) U.S. Cl.
  CPC .......... *G11C 16/3459* (2013.01); *G11C 16/08* (2013.01); *G11C 16/102* (2013.01)
(58) Field of Classification Search
  CPC .... G11C 16/3459; G11C 16/08; G11C 16/102
  See application file for complete search history.

(56) References Cited

U.S. PATENT DOCUMENTS

| | | | | |
|---|---|---|---|---|
| 7,616,496 B2 * | 11/2009 | Choi | ................... | G11C 16/3454 365/199 |
| 8,081,513 B2 * | 12/2011 | Fukuda | .............. | G11C 16/3404 365/185.24 |
| 8,179,720 B2 * | 5/2012 | Fukuda | .............. | G11C 16/3436 365/185.23 |
| 10,943,663 B1 * | 3/2021 | Wang | ..................... | G11C 16/12 |

* cited by examiner

*Primary Examiner* — Vanthu T Nguyen
(74) *Attorney, Agent, or Firm* — Oblon, McClelland, Maier & Neustadt, L.L.P.

(57) ABSTRACT

Disclosed is a memory device comprising: a memory cell array having a plurality of rows of memory cells; a plurality of word lines coupled to the plurality of rows of memory cells respectively; wherein the memory device is configured to perform programming operations on a target memory cell in the plurality of rows of memory cells, wherein during the programming operations: applying a programming voltage to a selected word line corresponding to a row where the target memory cell locates to program the target memory cell to a target programming state; applying a predetermined voltage to the selected word line to reduce voltage changes caused by capacitive coupling between an unselected word line adjacent to the selected word line and the selected word line; and applying a verification voltage to the selected word line to perform verification operations to verify whether a threshold voltage of the target memory cell is larger than a target threshold voltage corresponding to the target programming state based on the predetermined voltage.

20 Claims, 9 Drawing Sheets

MEMORY DEVICE AND PROGRAM OPERATION THEREOF TO REDUCE CAPACITIVE COUPLING

TECHNICAL FIELD

The present disclosure relates to memory devices and program operation thereof.

BACKGROUND

When programming solid-state drive (SSD) memory cells, especially for multi-level cells of NAND flash several verification operations are performed after programming pulses to form target programming states with different threshold voltages. Due to that the programming pulse time in programming cycles is usually much shorter than the verification operation time, the time overhead and power consumption brought by the verification operations are often very large, which also degrades the programming performance of the memory device.

Therefore, there is a need for memory device programming methods capable of reducing the time overhead of the verification operations, so as to further improve the programming performance.

SUMMARY

According to an aspect of the present disclosure, a memory device is disclosed which comprises: a memory cell array having a plurality of rows of memory cells; a plurality of word lines coupled to the plurality of rows of memory cells respectively, wherein the memory device is configured to perform programming operations on a target memory cell in the plurality of rows of memory cells, wherein during the programming operations: applying a programming voltage to a selected word line corresponding to a row where the target memory cell locates to program the target memory cell to a target programming state; applying a predetermined voltage to the selected word line to reduce voltage changes caused by capacitive coupling between an unselected word line adjacent to the selected word line and the selected word line; and applying a verification voltage to the selected word line to perform verification operations to verify whether a threshold voltage of the target memory cell is larger than a target threshold voltage corresponding to the target programming state.

In some implementations, the predetermined voltage is set such that a voltage of the selected word line is close to the target threshold voltage corresponding to the target programming state at the beginning of the verification operations. Further, the predetermined voltage applied is determined according to the target threshold voltage corresponding to the target programming state.

In some implementations, a pass voltage is applied to an unselected word line corresponding to memory cells of other rows except the row where the target memory cell locates in the plurality of rows of memory cells for the memory cells of other rows.

In some implementations, a pass voltage applied to the unselected word line adjacent to the selected word line is larger than a pass voltage applied to other unselected word lines.

According to another aspect of this application, a method for operating a memory device is disclosed. The memory device comprises a memory cell array having a plurality of rows of memory cells and a plurality of word lines coupled to the plurality of rows of memory cells respectively. The method comprises: determining a target memory cell in the plurality of rows of memory cells; applying a programming voltage to a selected word line corresponding to a row where the target memory cell locates to program the target memory cell to a target programming state; applying a predetermined voltage to the selected word line to reduce voltage changes caused by capacitive coupling between an unselected word line adjacent to the selected word line and the selected word line; and applying a verification voltage to the selected word line to perform verification operations to verify whether a threshold voltage of the target memory cell is larger than a target threshold voltage corresponding to the target programming state.

These and other objects of the present disclosure will undoubtedly become apparent to those skilled in the art after reading the following detailed description of the preferred embodiments shown in various drawings.

DETAILED DESCRIPTION

Figure 1:
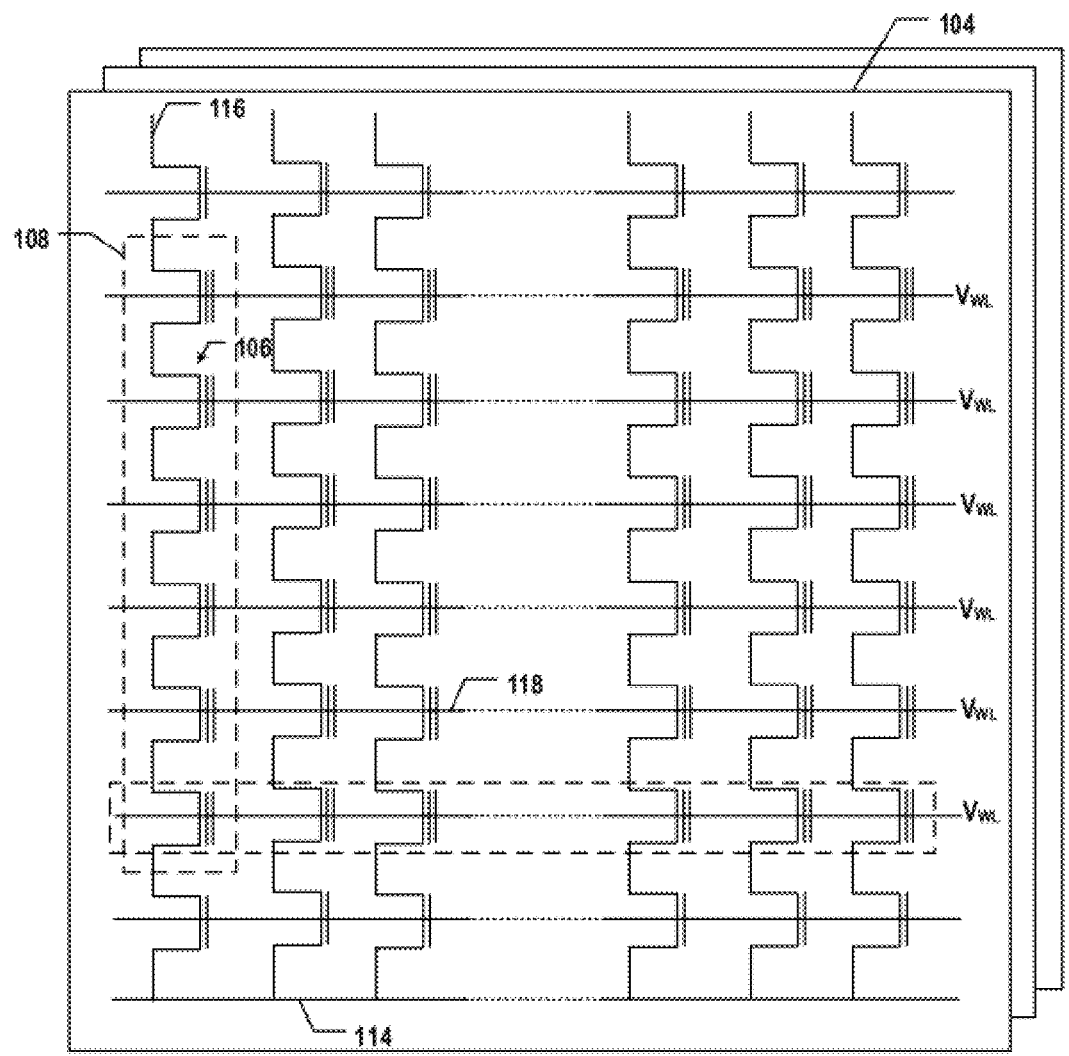
FIG. 1 shows a schematic circuit diagram of an exemplary memory device.

FIG. 1 shows a schematic circuit diagram of an exemplary memory device. The memory device shown in FIG. 1 can be a NAND Flash memory cell array in which memory cells 106 are provided in the form of NAND memory strings 108. The memory device comprises a memory cell array having a plurality of rows of memory cells 106 and a plurality of word lines 118 coupled to the plurality of rows of memory cells 106 respectively. According to some implementations, NAND memory strings 108 can be organized into multiple memory blocks 104, each of which can have a common source line 114. NAND memory strings 108 in the same block 104 are coupled through a common source line 114, for example, to the ground. Each NAND memory string 108 is coupled to a respective bit line 116 from which data can be read via an output bus (not shown), according to some implementations. Memory cells 106 of adjacent NAND memory strings 108 can be coupled through a word line 118 which is used for selecting which row of memory cells is affected by reading and programming operations. During the programming operations, the memory cells coupled to a same word line in the same memory block may be applied with a same programming voltage/pulse and verification voltage/pulse.

The memory cell could be a multi-level cell (MLC). An MLC is a memory cell which is capable of storing more than a single bit of data in more than two memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

A target memory cell to be programmed is determined during operation of the memory device and a programming voltage is applied to a selected word line corresponding to the target memory cell. Program operations performed on the target memory cell include programming and verification operations. When a programming voltage is applied to program the target memory cell to a target programming state, a threshold voltage of the selected memory cell changes after a programming pulse is applied to the selected memory cell. Thus, after application of the programming pulse, a verification operation needs to be performed on the memory cell to verify whether the threshold voltage of the memory cell is larger than a target threshold voltage corresponding to the target programming state. If the threshold voltage of the memory cell is larger than the target threshold voltage, it is proved that the memory cell has been successfully programmed to the target programming state. If the threshold voltage of the memory cell does not reach the target threshold voltage, it is proved that the memory cell has not been programmed to the target programming state.

Figure 2:
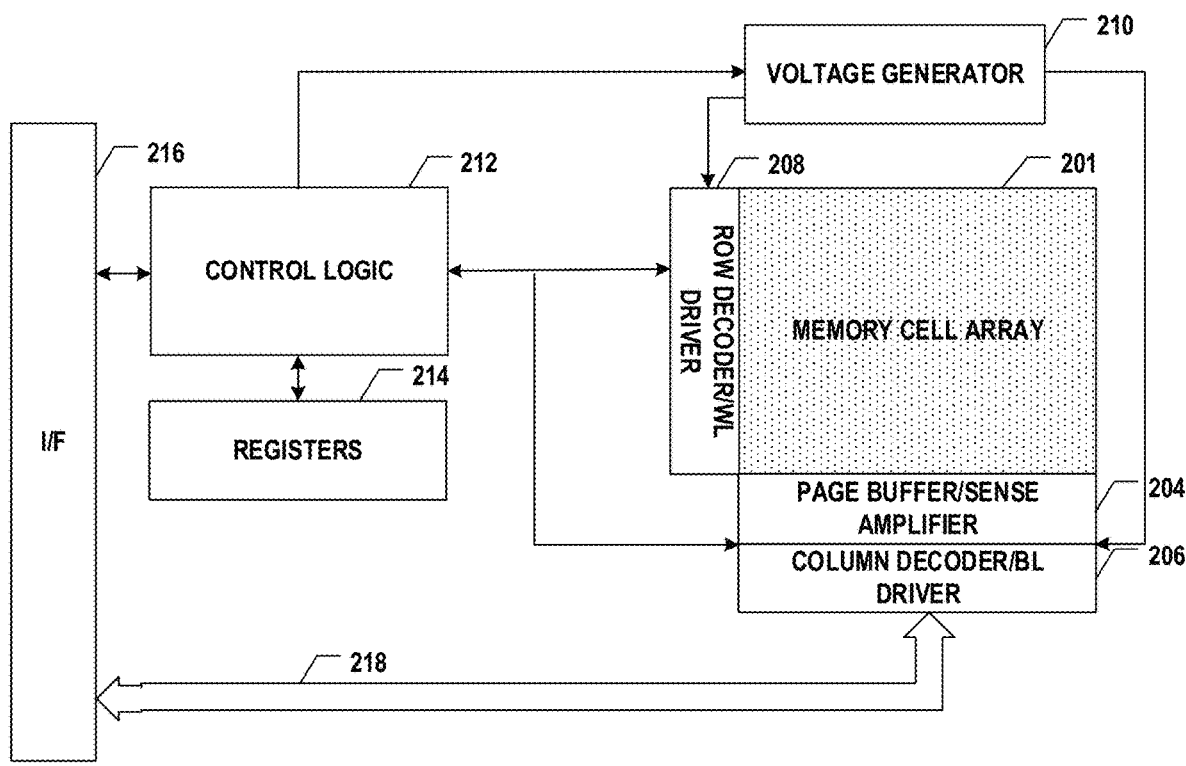
FIG. 2 illustrates a block diagram of a memory device including a memory cell array and peripheral circuits, according to some aspects of the present disclosure.

Referring back to FIG. 1, peripheral circuits (not shown in FIG. 1) can be coupled to the NAND flash memory cell array through bit lines 116, word lines 118, source lines 114. Peripheral circuits can include any suitable analog, digital, and mixed-signal circuits for facilitating the operations of memory cell array by applying and sensing voltage signals and/or current signals to and from each select memory cell 106 through bit lines 116, word lines 118, source lines 114. Peripheral circuits can include various types of peripheral circuits formed using metal-oxide-semiconductor (MOS) technologies. For example, FIG. 2 illustrates some exemplary peripheral circuits including a page buffer/sense amplifier 204, a column decoder/bit line driver 206, a row decoder/word line driver 208, a voltage generator 210, control logic 212, registers 214, an interface (I/F) 216, and a data bus 218. It is understood that in some examples, additional peripheral circuits not shown in FIG. 2 may be included as well.

Page buffer/sense amplifier 204 can be configured to sense (read) and program (write) data from and to memory cell array 201 (e.g. the NAND Flash memory cell array described in FIG. 1) according to the control signals from control logic 212. In one example, page buffer/sense amplifier 204 may store one page of program data (write data, referred to herein as "data page") to be programmed into one page of memory cell array 201. In another example, page buffer/sense amplifier 204 may verify programmed select memory cells 106 in each program/verify loop (cycle) in a program operation to ensure that the data has been properly programmed into memory cells 106 coupled to select word lines. In still another example, page buffer/sense amplifier 204 may also sense the low power signals from bit line 116 that represents a data bit stored in memory cell 106 and amplify the small voltage swing to recognizable logic levels in a read operation. As described below in detail and consistent with the scope of the present disclosure, in program operations, page buffer/sense amplifier 204 can include a plurality of page buffer circuits respectively coupled to bit lines 116, and each including a set of storage units (e.g., latches) for temporarily storing a piece of N-bits data received from data bus 218 (converted from a piece of N-bits raw data based on a Gray code) and providing the piece of N-bits data to a corresponding select memory cell 106 through the corresponding bit line 116 in a program operation using a multi-cache loading scheme.

Column decoder/bit line driver 206 can be configured to be controlled by control logic 212 and select one or more NAND memory strings 108 by applying bit line voltages generated from voltage generator 110. Row decoder/word line driver 208 can be configured to be controlled by control logic 212 and select/deselect blocks 104 of memory cell array 201 and select/deselect word lines of block 104. Row decoder/word line driver 208 can be further configured to drive word lines 118 using word line voltages generated from voltage generator 210. In some implementations, row decoder/word line driver 208 can also select/deselect and drive SSG lines and DSG lines as well. Voltage generator 210 can be configured to be controlled by control logic 212 and generate the word line voltages (e.g., read voltage, program voltage, channel pass voltage, local voltage, verify voltage, etc.), bit line voltages, and source line voltages to be supplied to memory cell array 201.

Control logic 212 can be coupled to each peripheral circuit described above and configured to control the operations of each peripheral circuit. Registers 214 can be coupled to control logic 212 and include status registers, command registers, and address registers for storing status information, command operation codes (OP codes), and command addresses for controlling the operations of each peripheral circuit. Interface 216 can be coupled to control logic 212 and act as a control buffer to buffer and relay control commands received from a memory controller (e.g., 806 in FIG. 8) and/or a host (e.g., 808 in FIG. 8) to control logic 212 and status information received from control logic 212 to the memory controller and/or the host. Interface 216 can also be coupled to column decoder/bit line driver 206 via data bus 218 and act as a data input/output (I/O) interface and a data buffer to buffer and relay the data to and from memory cell array 201.

Figure 3:
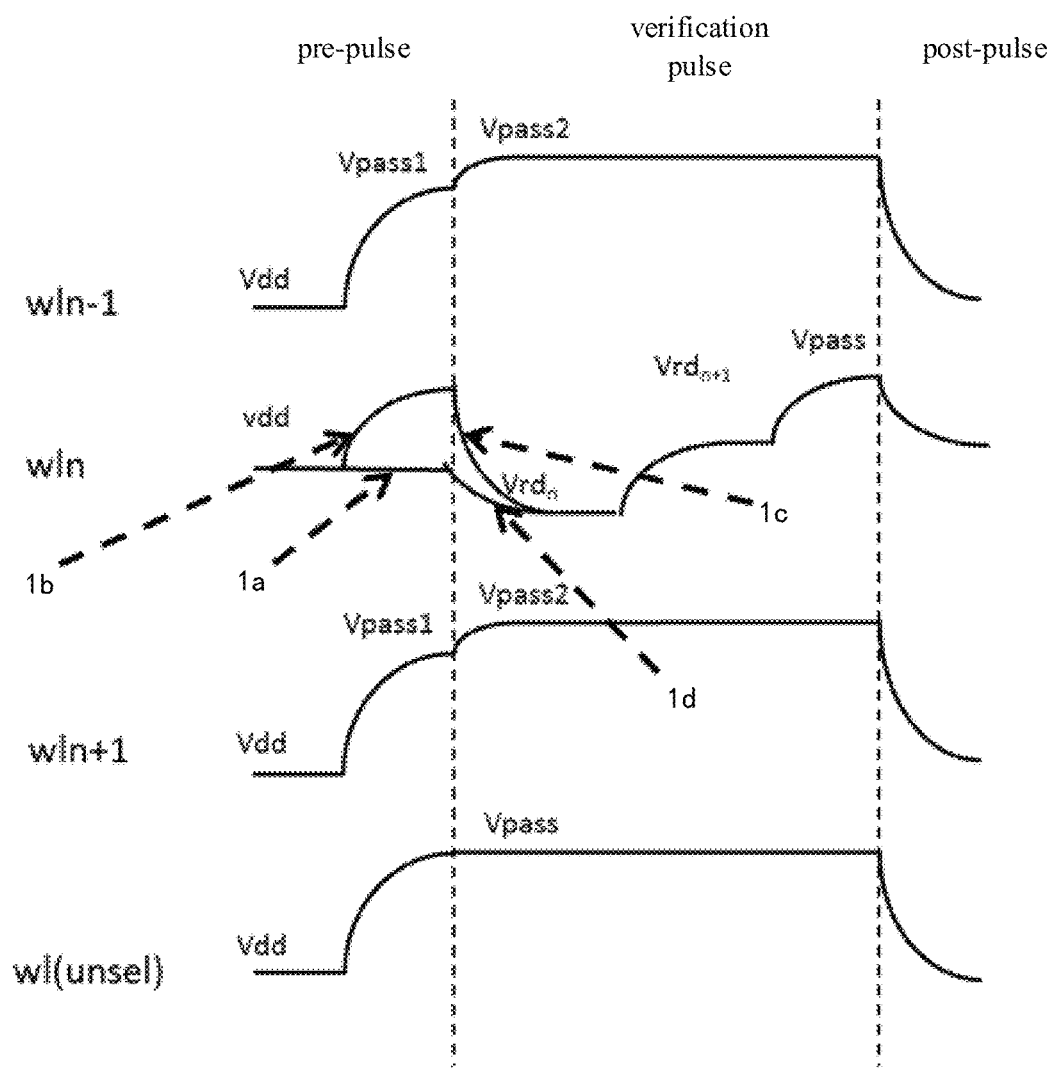
FIG. 3 shows a waveform diagram of word line voltages during a verification period according to a programming method.

FIG. 3 shows a waveform diagram of word line voltages during a verification period according to a method for programming MLC memory cells. As shown in FIG. 3, wln is specified as a selected word line, and a target memory cell to be verified is coupled to the selected word line, wherein wln−1 and wln+1 are unselected word lines adjacent to the selected word line wln, and wl (unsel) is another unselected word line in the memory block. The verification period of a memory cell can be divided into three phases. First, a pass voltage is applied to the unselected word lines in the memory block at a pre-pulse phase to raise the voltages of the unselected word lines from the supply voltage Vdd to the pass voltage Vpass1 or Vpass. The pass voltage is a voltage that turns on the memory cells. The selected word line in the memory block will remain at the supply voltage Vdd during the pre-pulse phase. Next, a range of verification voltages are applied to the selected word line at a verification pulse phase to verify whether the threshold voltage of the target memory cell is larger than the target threshold voltage corresponding to the target programming state. At the same time, a pass voltage is applied to the unselected word lines to raise the voltages of the unselected word lines from the pass voltage Vpass1 to the pass voltage Vpass2 or remains at Vpass. Finally, the word lines in the memory block are discharged at a post-pulse phase.

However, due to the long length of the word lines and the tight layout of the word lines of the memory device, voltage may vary (for example, increase) at the far end of the word lines because of capacitive coupling of adjacent word lines when voltages are applied to corresponding word lines through the word line contact during the pre-pulse phase. In some implementations, one end of the word line where the word line contact is located is referred to as a near end, and the other end of the word line away from the word line contact is referred to as a far end. Thus, the word line voltage at the far end of the selected word line may rise due to capacitive coupling of adjacent word lines, resulting in the voltage at the far end of the selected word line not being maintained at the supply voltage Vdd and thereby resulting in a longer time consumed for the word line voltage to reach a verification pulse when the verification pulse is applied to the selected word line.

In some implementations, referring to FIG. 3, the pass voltage Vpass1 is applied to the unselected word lines wln−1 and wln+1 in the pre-pulse phase before the verification pulse and after the programming pulse is applied to the selected word line wln to pre-charge the voltages of the unselected word lines wln−1 and wln+1 from the supply voltage Vdd to the pass voltage Vpass1. Meanwhile, the pass voltage Vpass is applied to another unselected word line wl (unsel) to pre-charge the voltage of the unselected word line from the supply voltage Vdd to the pass voltage Vpass.

Ideally, the voltage of the selected word line wln should be kept at Vdd as shown by the curve indicated by arrow 1a. However, due to capacitive coupling between the selected word line and adjacent unselected word lines, the voltage of the word line wln at the far end of the selected word line wln may rise significantly even above the target threshold voltage (i.e. the verification voltage $vrd_n$) of the target programming state to be verified, as shown by the curve indicated by arrow 1b.

Figure 4:
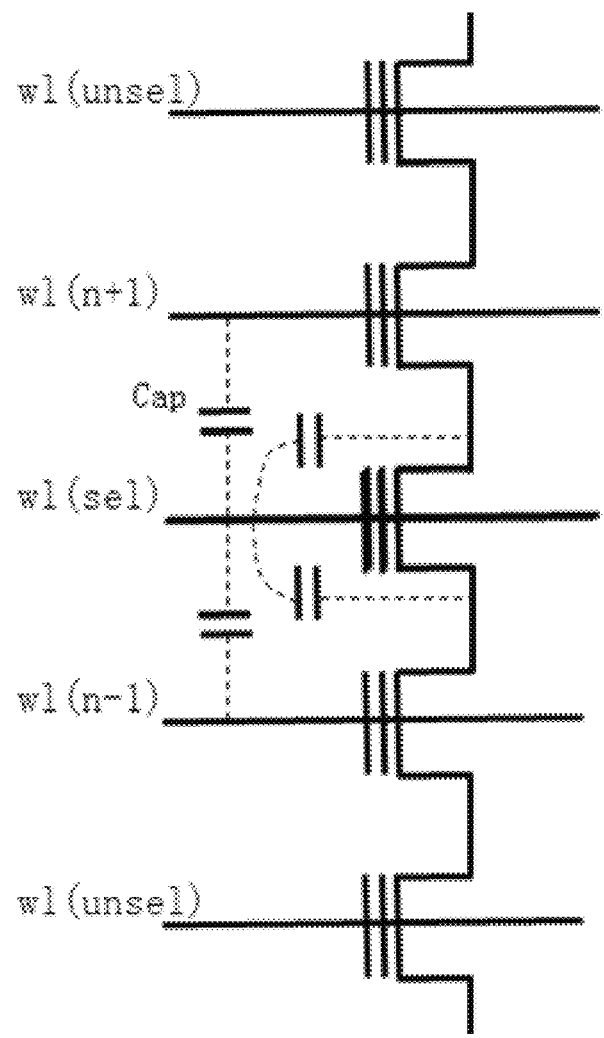
FIG. 4 shows a schematic circuit diagram of a memory string of a memory device.

The principle of this capacitive coupling of the word lines wln is shown in a schematic circuit diagram of a memory string in FIG. 4. As shown in FIG. 4, a capacitance Cap exists between the selected word line wl (sel) and adjacent unselected word lines wl (n−1) and wl (n+1) respectively. The capacitor Cap therefore causes the voltage of the selected word line wl (sel) to rise when voltages are applied to the unselected word lines wl (n−1) and wl (n+1).

Referring back to FIG. 3, since this coupling boost of the selected word line wln as indicated by arrow 1b, it is necessary to wait for the word line wln to discharge from a higher voltage until reaching the verification voltage $vrd_n$ of the target programming state at the beginning of the verification pulse phase. It takes a long time for this discharge process, as shown by the voltage discharge curve indicated by arrow 1c, resulting in a relatively slow establishment of the verification voltage for the target programming state and increasement of the time overhead of the verification operations.

Furthermore, even if the word line voltage at the near end of the selected word line wln is less affected by the capacitive coupling of adjacent word lines and may still be maintained substantially at the supply voltage Vdd as shown by the curve indicated by arrow 1a, but the word line voltage at this time is still higher than the verification voltage $vrd_n$ of the target programming state to be verified for verification voltages of certain target programming states, thus it may wait for the word line voltage to discharge to the target verification voltage $vrd_n$ at the beginning of the verification pulse phase, as shown by the voltage discharge curve indicated by arrow 1d. This discharge process also leads to the slow establishment of the verification voltage for the target programming state, which makes the time overhead of the verification operations larger.

To solve the above-mentioned problem of slow establishment of the word line voltage due to capacitive coupling boost of adjacent word lines, the present disclosure provides a method for operating a memory device which can shorten the establishment time of the word line voltage in the verification pulse phase to improve programming performance.

Figure 5:
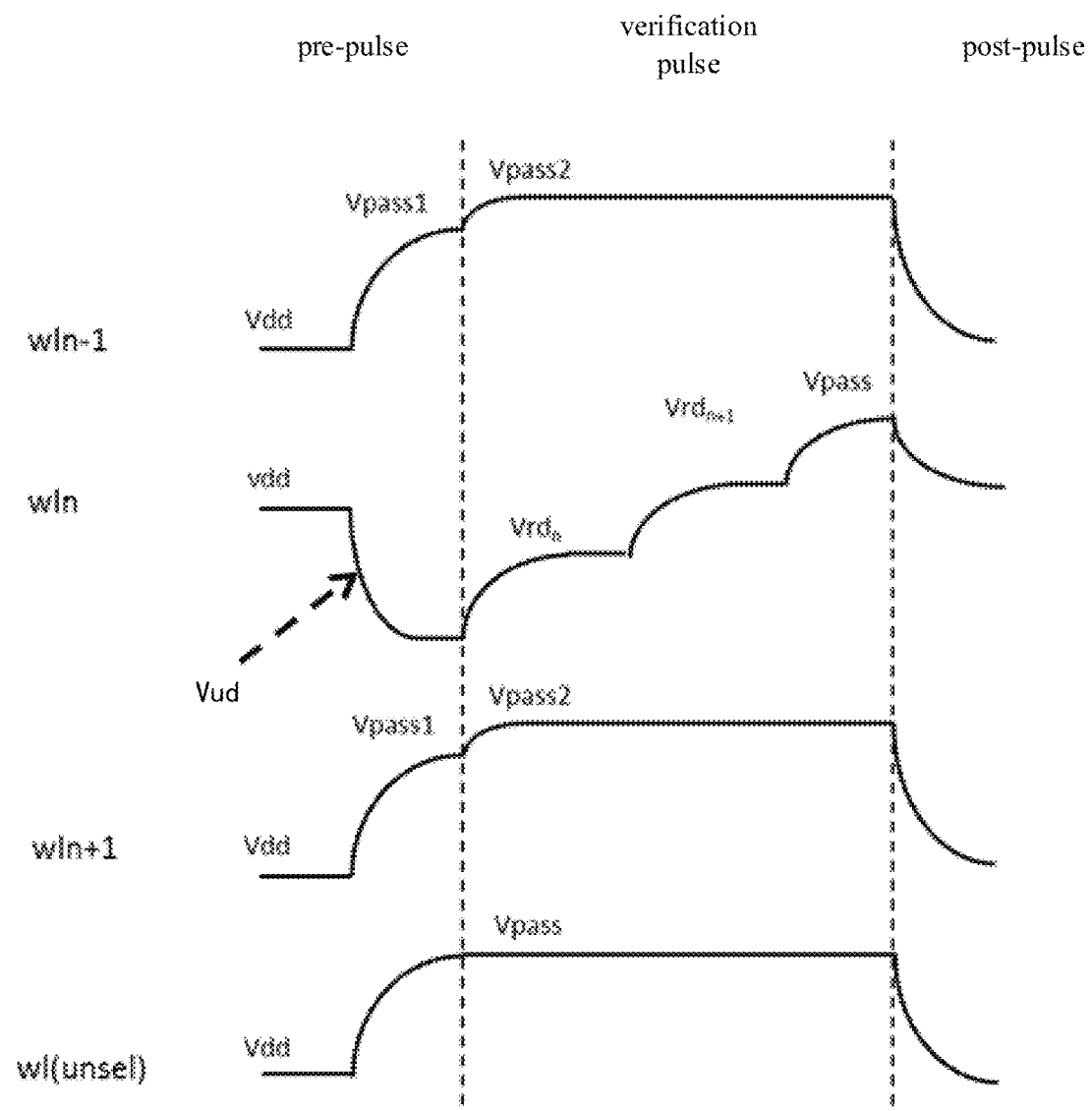
FIG. 5 shows a waveform diagram of word line voltages during a verification period according to a programming method of an implementation of the present disclosure.

FIG. 5 shows a waveform diagram of word line voltages during a verification period according to a programming method of an embodiment of the present disclosure. As shown in FIG. 5, the pass voltage Vpass1 is applied to the unselected word lines wln−1 and wln+1 in the pre-pulse phase of the verification operation after the programming pulse is applied to the selected word line wln to pre-charge the voltages of the unselected word lines wln−1 and wln+1 from the supply voltage Vdd to the pass voltage Vpass1. Meanwhile, a pass voltage Vpass is applied to another unselected word line wl (unsel) to pre-charge the voltage of the unselected word line from the supply voltage Vdd to the pass voltage Vpass. A predetermined voltage Vud is applied to the selected word line wln in the pre-pulse phase as shown in FIG. 5, to reduce or mitigate to some extent the influence on the selected word line due to capacitive coupling between adjacent unselected word lines wln−1 and wln+1 and the selected word line wln, such as voltage rise.

In some implementations, the application of the predetermined voltage Vud enables the voltage of the selected word line wln to be lower or slightly lower than the verification voltage of the target programming state at the beginning of the verification pulse phase for at least some target programming states. In this way, for these target programming states, it is not necessary to wait for the selected word line wln to slowly discharge to the verification voltage $vrd_n$ at the beginning of the verification pulse phase, rather the word line voltage can rapidly rise to the verification voltage $vrd_n$ when the verification voltage $vrd_n$ is applied, thereby greatly shortening the establishment time of the word line voltage.

However, such selection of the predetermined voltage Vud may only work for some the target programming states of the memory cell, while the establishment time of the word line voltage may still be long when the remaining target programming states of the memory cell are verified. Therefore, in order to further improve the programming performance of the memory device, it is necessary to select the predetermined voltage Vud for each target programming state of each memory cell in the memory block, so that the voltage of the selected word line can be closer to the verification voltage of the target programming state to be verified at the beginning of the verification pulse phase, thereby further shortening the time of the verification operations.

In some implementations, determining the predetermined voltage Vud according to a target threshold voltage corresponding to a target programming state of the memory cell to be verified. For example, the predetermined voltage Vud is determined by the target threshold voltage corresponding to the target programming state of the memory cell to be verified and an adjustment voltage value Δ. In some implementations, the predetermined voltage Vud is the difference between the target threshold voltage corresponding to the target programming state of the memory cell to be verified and the adjustment voltage value Δ.

In some implementations, the above-mentioned adjustment voltage value Δ is predetermined according to each target programming state of each memory cell. In other words, different adjustment voltage values Δ can be selected for verification voltages $vrd_n$, $vrd_{n+1}$ and the like of different target programming states of different memory cells. The adjustment voltage value Δ can be pre-debugged, determined and stored in the memory device, and the adjustment voltage value Δ can be automatically applied during the programming operations of the memory device to shorten the establishment time of the word line voltage and improve the programming performance of the memory device.

In addition, as shown in FIG. 5, a pass voltage Vpass1 is applied to adjacent unselected word lines wln−1 and wln+1 of the selected word line wln in the pre-pulse phase and a pass voltage Vpass2 is applied to adjacent unselected word lines wln−1 and wln+1 of the selected word line wln in the verification pulse phase. In an embodiment, the pass voltage Vpass1 may be different from the pass voltage Vpass2. In another implementation, the pass voltage Vpass1 may be the same as the pass voltage Vpass2.

It should also be noted that a pass voltage Vpass is applied to the remaining unselected word lines wl (unsel) during the pre-pulse phase, and the pass voltage Vpass is generally lower than the pass voltage Vpass1 applied to the adjacent unselected word lines wln−1 and wln+1.

Figure 6:
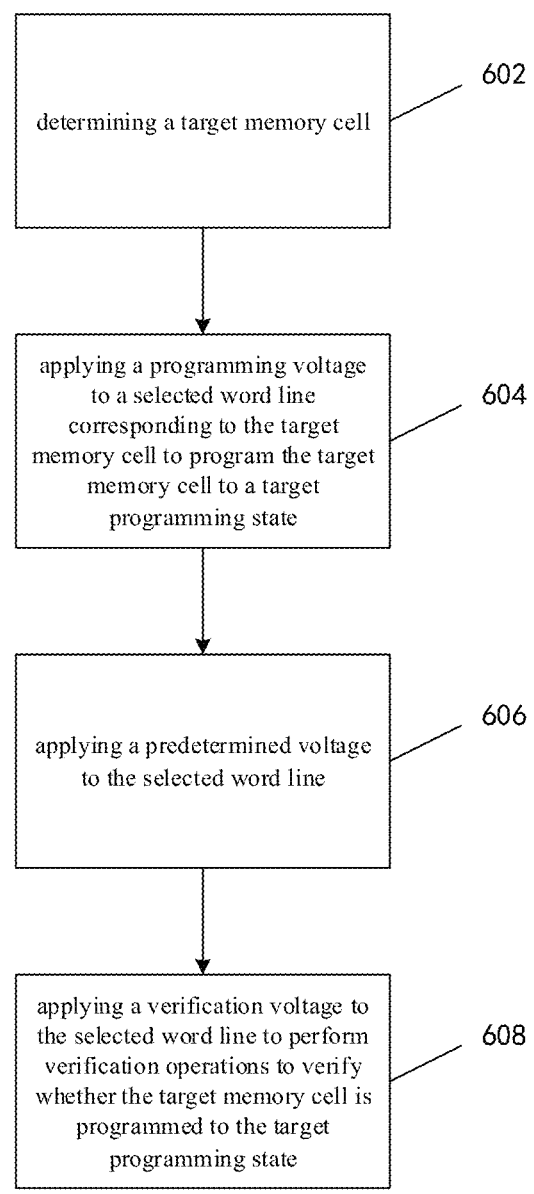
FIG. 6 shows a flowchart of a method of operating a memory device according to an implementation of the present disclosure.

FIG. 6 shows a flowchart of a method of operating a memory device according to an embodiment of the present disclosure.

Method includes operation 602 where a target memory cell is selected from a plurality of rows of memory cells of a memory device. The target memory cell is a memory cell to be programmed.

Method then proceeds to operation 604 where a programming voltage is applied to a selected word line corresponding to the target memory cell to program the target memory cell to a target programming state. In an embodiment, a gate of the target memory cell is coupled to the selected word line, which is shown as wln in FIGS. 3 and 5.

Method then proceeds to operation 606 where a predetermined voltage Vud is applied to the selected word line to reduce capacitive coupling between unselected word lines adjacent to the selected word line and the selected word line. Such capacitive coupling as previously described can cause the voltage of the selected word line to rise unexpectedly prior to the verification pulse phase, resulting in an increasement in the time of the verification operations. The application of the predetermined voltage Vud can reduce or cancel this capacitive coupling to some extent. The predetermined voltage Vud is determined according to the target threshold voltage corresponding to the target programming state of the memory cell to be verified as described above. The predetermined voltage Vud is determined by the target threshold voltage corresponding to the target programming state of the memory cell to be verified and an adjustment voltage value Δ. In an embodiment, such an adjustment voltage value Δ is determined according to each target programming state of each memory cell.

In some implementations, pass voltages are also applied to unselected word lines (e.g. wln−1, wln+1 and wl (unsel)), respectively. The pass voltage applied to the unselected word line (e.g. wln−1, wln+1) adjacent to the selected word line is larger than the pass voltages applied to the remaining unselected word lines (e.g. wl (unsel) as described above.

Method then proceeds to operation 608 where a verification voltage is applied to the selected word line to perform a verification operation to verify whether the target memory cell has been programmed to the target programming state based on the predetermined voltage. Specifically, if the threshold voltage of the target memory cell is larger than the target threshold voltage corresponding to the target programming state, the target memory cell has been programmed to the target programming state. If the threshold voltage of the target memory cell does not reach the target threshold voltage corresponding to the target programming state, a programming pulse is continued to be applied to the memory cell in the next programming cycle to program the memory cell to the target programming state, and likewise, the programming state of the memory cell is verified using the verification method as described in the present disclosure.

FIG. 6 shows a schematic waveform diagram of a programming method according to an embodiment of the present disclosure compared to the programming method shown in FIG. 2.

Figure 7:
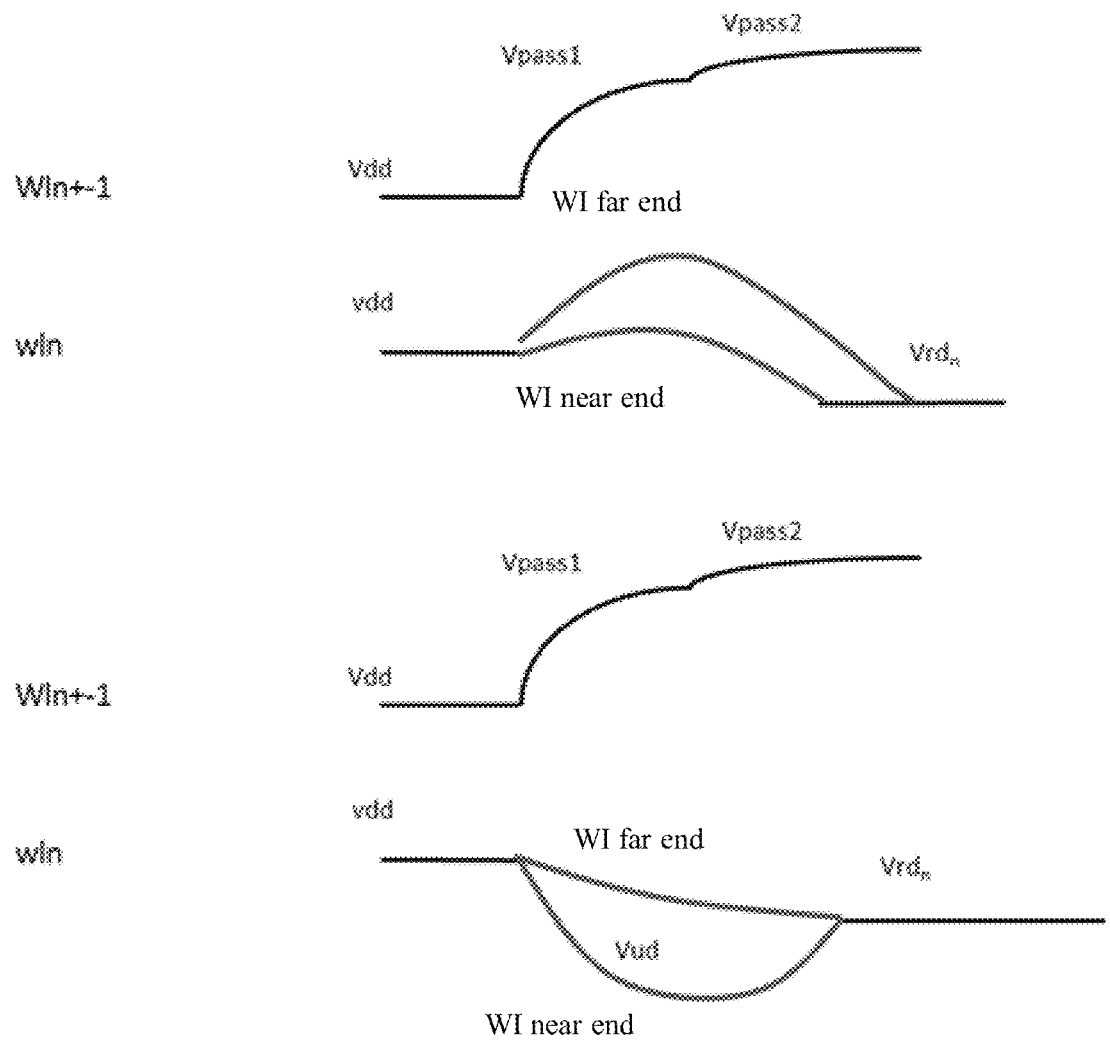
FIG. 7 is a schematic waveform diagram of a programming method according to an implementation of the present disclosure compared to the programming method shown in FIG. 2.

It can be seen from the upper half of FIG. 7 that the voltages at both the near end and the far end of the selected word line wln rise to varying degrees due to capacitive coupling between adjacent unselected word lines wln−1 and wln+1 and the selected word line wln during the pre-pulse phase in the verification operation period when the verification is performed using the programming method shown in FIG. 3. Thus, it may wait for the selected word line wln to slowly discharge until the required verification voltage $vrd_n$ is restored at the beginning of the verification period. It can also be seen from the figure that the voltage boost at the far end is higher than that at the near end because the capacitive coupling at the far end is stronger than that at the near end, resulting in a longer establishment time of the word line verification voltage at the far end than that at the near end, and a longer time consumed by the verification operations.

It can be seen from the lower half of FIG. 7 that a predetermined voltage Vud is applied to the selected word line wln during the pre-pulse phase in the verification operation period to reduce capacitive coupling between adjacent unselected word lines wln−1 and wln+1 and the selected word line wln when the verification is performed using the programming method according to the present disclosure. In this way, the voltages at both the near end and the far end of the selected word line wln reduce to varying degrees, that is, the coupling boost is reduced or cancelled. In this way, it is no longer necessary to wait for the selected word line wln to slowly discharge at the beginning of the verification period, instead, the voltage of the selected word line wln can quickly reach the required verification voltage $vrd_n$. Therefore, the overall establishment time of the word line verification voltage is shortened, so that the time consumed by the verification operations is also shortened and the programming performance is improved.

In summary, the method for operating a memory device provided by the embodiments of the present disclosure may apply a predetermined voltage to a selected word line in a memory block during a pre-pulse phase in a verification operation period. Therefore, the predetermined voltage can be used to reduce capacitive coupling between adjacent unselected word lines and the selected word line. Further, the predetermined voltage can be selected for each target programming state to be verified of each memory cell, so that the voltage of the selected word line is closer to the verification voltage of the target programming state to be verified at the beginning of the verification pulse phase, thereby further shortening the establishment time of the word line voltage. Therefore, it is possible to reduce the time consumed by the verification operations without consuming additional circuit area, and it is possible to improve the programming performance and programming efficiency. In addition, this method does not restrict the order of programming and verification, and it is flexible and easy to implement.

Figure 8:
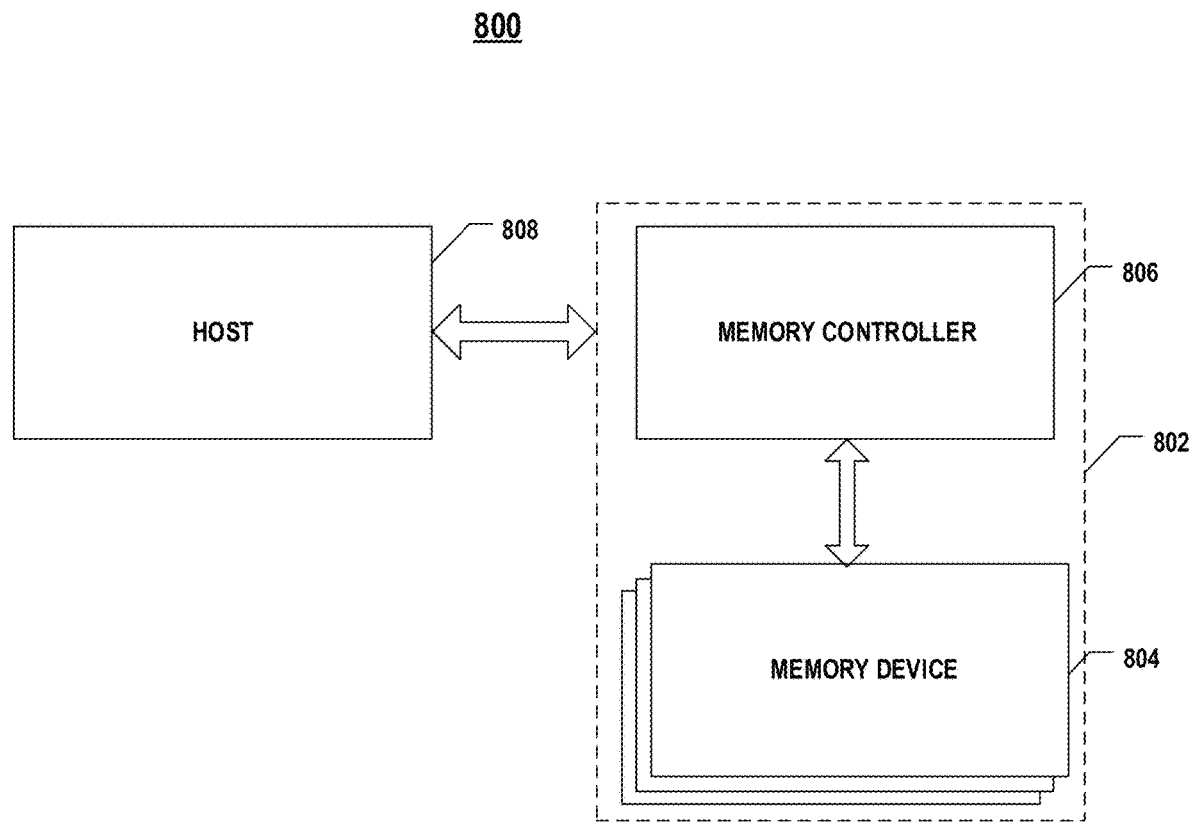
FIG. 8 illustrates a block diagram of a system having a memory device, according to some aspects of the present disclosure.

FIG. 8 illustrates a block diagram of a system 800 having a memory device, according to some aspects of the present disclosure. System 800 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 8, system 800 can include a host 808 and a memory system 802 having one or more memory devices 804 and a memory controller 806. Host 808 can be a processor of an electronic device, such as a central processing unit (CPU), or a system-on-chip (SoC), such as an application processor (AP). Host 808 can be configured to send or receive data to or from memory devices 804.

Memory device 804 can be any memory device disclosed in the present disclosure. As disclosed above in detail, memory device 804, such as a NAND Flash memory device, can perform a program operation on a target memory cell in a plurality of rows of memory cells, the program operation includes programming operation and verification operation, wherein to perform the program operation, the peripheral circuit is configured to apply a programming voltage to a selected word line to program a target memory cell to a target programming state, then to perform a verification operation to the target memory cell, the peripheral circuit is further configured to apply a first voltage(e.g. a predetermined voltage) lower than a second voltage (e.g. Vdd shown in FIG. 5) to the selected word line wln (shown in FIG. 5) in a pre-pulse period, and apply a third voltage (e.g. Vpass1 shown in FIG. 5) to the wln−1 and wln+1 adjacent to the wln in the pre-pulse period, the third voltage is larger than the second voltage.

In a verification pulse period, the peripheral circuit is further configured to apply a fourth voltage (e.g. $vrd_n$ shown in FIG. 5) larger than the first voltage to the selected word line wln, and apply a fifth voltage (e.g. Vpass2 shown in FIG. 5) larger than the third voltage to the word line wln−1 and the word line wln+1 adjacent to the wln. By applying a lower voltage to the selected word line wln in the pre-pulse period, voltage changes caused by capacitive coupling between an unselected word line adjacent to the selected word line and the selected word line can be reduced.

Memory controller 806 is coupled to memory device 804 and host 808 and is configured to control memory device 804, according to some implementations. Memory controller 806 can manage the data stored in memory device 804 and communicate with host 808. In some implementations, memory controller 806 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 806 is designed for operating in a high duty-cycle environment SSDs or embedded multi-media-cards (eMMCs) used as data storage for mobile devices, such as smartphones, tablets, laptop computers, etc., and enterprise storage arrays. Memory controller 806 can be configured to control operations of memory device 804, such as read, erase, and program operations. Memory controller 806 can also be configured to manage various functions with respect to the data stored or to be stored in memory device 804 including, but not limited to bad-block management, garbage collection, logical-to-physical address conversion, wear leveling, etc. In some implementations, memory controller 806 is further configured to process error correction codes (ECCs) with respect to the data read from or written to memory device 804. Any other suitable functions may be performed by memory controller 806 as well, for example, formatting memory device 804. Memory controller 806 can communicate with an external device (e.g., host 808) according to a particular communication protocol. For example, memory controller 806 may communicate with the external device through at least one of various interface protocols, such as a USB protocol, a multimedia card (MMC) protocol, a peripheral component interconnection (PCI) protocol, a PCI-express (PCL-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 9A:
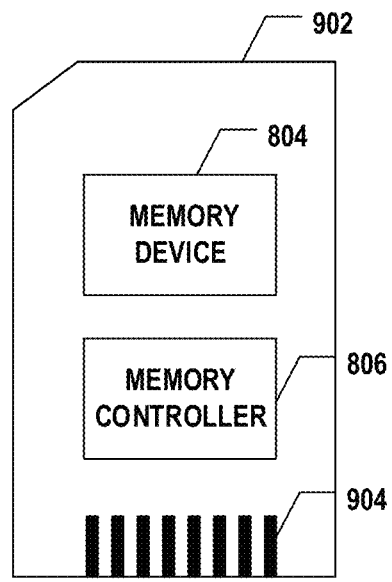
FIG. 9A illustrates a diagram of a memory card having a memory device, according to some aspects of the present disclosure.
Figure 9B:
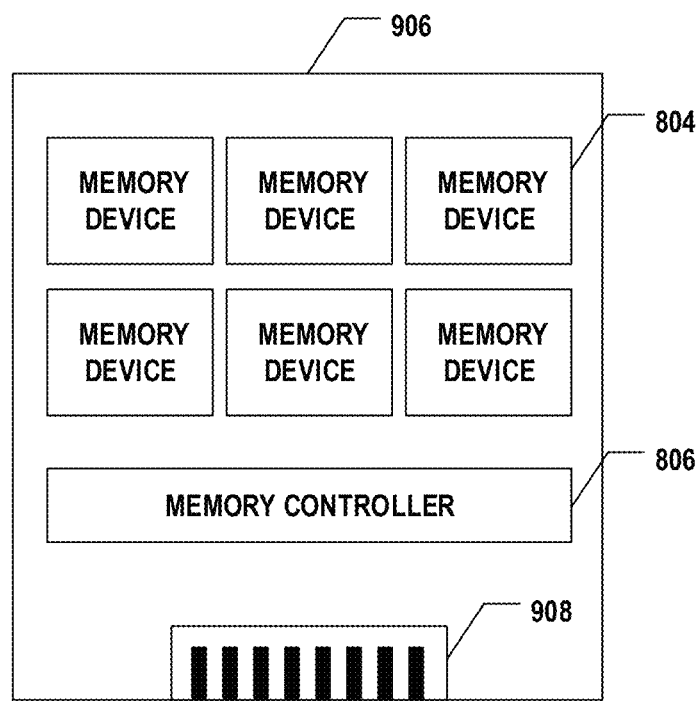
FIG. 9B illustrates a diagram of a solid-state drive (SSD) having a memory device, according to some aspects of the present disclosure.

Memory controller 806 and one or more memory devices 804 can be integrated into various types of storage devices, for example, being included in the same package, such as a universal Flash storage (UFS) package or an eMMC package. That is, memory system 802 can be implemented and packaged into different types of end electronic products. In one example as shown in FIG. 9A, memory controller 806 and a single memory device 804 may be integrated into a memory card 902. Memory card 902 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 902 can further include a memory card connector 904 coupling memory card 902 with a host (e.g., host 808 in FIG. 8). In another example as shown in FIG. 9B, memory controller 806 and multiple memory devices 804 may be integrated into an SSD 906, SSD 906 can further include an SSD connector 908 coupling SSD 906 with a host (e.g., host 808 in FIG. 8). In some implementations, the storage capacity and/or the operation speed of SSD 906 is greater than those of memory card 902.

Those skilled in the art will readily find that various modifications and changes can be made to the device and method while maintaining the teachings of the present disclosure. The above disclosure should therefore be construed as being limited only by the scope of the appended claims.

What is claimed is:

1. A memory device comprising:
   a memory cell array having a plurality of rows of memory cells; and
   a plurality of word lines coupled to the plurality of rows of memory cells respectively;
   wherein the memory device is configured to:

perform programming operations on a target memory cell in the plurality of rows of memory cells, wherein during the programming operations:
applying a programming voltage to a selected word line corresponding to a row where the target memory cell locates to program the target memory cell to a target programming state;
applying a predetermined voltage to the selected word line to reduce voltage changes caused by capacitive coupling between an unselected word line adjacent to the selected word line and the selected word line;
applying a first pass voltage to the unselected word line, the first pass voltage starting to increase at a same time as when the predetermined voltage starts to reduce the voltage changes; and
applying a verification voltage to the selected word line after applying the predetermined voltage to the selected word line to perform verification operations, to verify whether a threshold voltage of the target memory cell is larger than a target threshold voltage corresponding to the target programming state, the predetermined voltage being lower than the verification voltage at beginning of the verification operations.

2. The memory device of claim 1, wherein the predetermined voltage is set such that a voltage of the selected word line is close to a target threshold voltage corresponding to the target programming state at the beginning of verification operations.

3. The memory device of claim 1, wherein the predetermined voltage is determined according to a target threshold voltage corresponding to the target programming state.

4. The memory device of claim 1, wherein the pass voltage applied to the unselected word line adjacent to the selected word line is larger than a pass voltage applied to other unselected word lines.

5. The memory device of claim 1, wherein the verification voltage is larger than the predetermined voltage.

6. The memory device of claim 1, wherein the pass voltage applied to the unselected word line adjacent to the selected word line is larger than the verification voltage.

7. A method for operating a memory device, the memory device comprises a memory cell array having a plurality of rows of memory cells and a plurality of word lines coupled to the plurality of rows of memory cells respectively, the method comprising:
determining a target memory cell in the plurality of rows of memory cells;
applying a programming voltage to a selected word line corresponding to a row where the target memory cell locates to program the target memory cell to a target programming state;
applying a predetermined voltage to the selected word line to reduce voltage changes caused by capacitive coupling between an unselected word line adjacent to the selected word line and the selected word line;
applying a first pass voltage to the unselected word line, the first pass voltage starting to increase at a same time as when the predetermined voltage starts to reduce the voltage changes; and
applying a verification voltage to the selected word line after applying the predetermined voltage to the selected word line to perform verification operations, to verify whether a threshold voltage of the target memory cell is larger than a target threshold voltage corresponding to the target programming state, the predetermined voltage being lower than the verification voltage at beginning of the verification operations.

8. The method of claim 7, wherein the predetermined voltage is set such that a voltage of the selected word line is close to a target threshold voltage corresponding to the target programming state at the beginning of verification operations.

9. The method of claim 7, wherein the predetermined voltage is determined according to a target threshold voltage corresponding to the target programming state.

10. The method of claim 7, wherein the pass voltage applied to the unselected word line adjacent to the selected word line is larger than a pass voltage applied to other unselected word lines.

11. A storage system comprising:
a memory device configured to store data, the memory device comprising:
a memory cell array having a plurality of rows of memory cells; and
a plurality of word lines coupled to the plurality of rows of memory cells respectively;
wherein the memory device is configured to:
perform programming operations on a target memory cell in the plurality of rows of memory cells, wherein during the programming operations:
applying a programming voltage to a selected word line corresponding to a row where the target memory cell locates to program the target memory cell to a target programming state;
applying a predetermined voltage to the selected word line to reduce voltage changes caused by capacitive coupling between an unselected word line adjacent to the selected word line and the selected word line;
applying a first pass voltage to the unselected word line, the first pass voltage starting to increase at a same time as when the predetermined voltage starts to reduce the voltage changes; and
applying a verification voltage to the selected word line after applying the predetermined voltage to the selected word line to perform verification operations, to verify whether a threshold voltage of the target memory cell is larger than a target threshold voltage corresponding to the target programming state, the predetermined voltage being lower than the verification voltage at beginning of the verification operations; and
a memory controller coupled to the memory device and configured to control the memory device.

12. The storage system of claim 11, wherein the predetermined voltage is set such that a voltage of the selected word line is close to a target threshold voltage corresponding to the target programming state at the beginning of verification operations.

13. The storage system of claim 11, wherein the predetermined voltage is determined according to a target threshold voltage corresponding to the target programming state.

14. The storage system of claim 11, wherein the pass voltage applied to the unselected word line adjacent to the selected word line is larger than a pass voltage applied to other unselected word lines.

15. The method of claim 7, wherein the verification voltage is larger than the predetermined voltage.

16. The method of claim 7, wherein the pass voltage applied to the unselected word line adjacent to the selected word line is larger than the verification voltage.

17. The storage system of claim 11, wherein the verification voltage is larger than the predetermined voltage.

18. The memory device of claim 1, wherein during the programming operations:
  applying a second pass voltage to the unselected word line when the verification voltage is applied to the selected word line.

19. The method of claim 7, further comprising:
  applying a second pass voltage to the unselected word line when the verification voltage is applied to the selected word line.

20. The storage system of claim 11, wherein during the programming operations,
  applying a second pass voltage to the unselected word line when the verification voltage is applied to the selected word line.

* * * * *